United States Patent [19]

Lur

[11] Patent Number: 5,438,015

[45] Date of Patent: Aug. 1, 1995

[54] SILICON-ON-INSULATOR TECHNIQUE WITH BURIED GAP

[75] Inventor: Water Lur, Taipei, Taiwan

[73] Assignee: United Microelectronics Corp., Hsinchu, Taiwan

[21] Appl. No.: 342,873

[22] Filed: Nov. 21, 1994

Related U.S. Application Data

[62] Division of Ser. No. 241,183, May 11, 1994.

[51] Int. Cl.⁶ ............................................. H01L 21/76
[52] U.S. Cl. ...................................... 437/62; 437/24; 437/927; 437/69
[58] Field of Search ............... 437/24, 26, 62, 69, 437/927; 148/DIG. 73, DIG. 85, DIG. 86, DIG. 118

[56] References Cited

U.S. PATENT DOCUMENTS

| | | |
|---|---|---|
| 4,888,300 | 12/1989 | Burton . |
| 4,925,805 | 5/1990 | Van Ommen et al. . |
| 5,204,282 | 4/1993 | Tsuruta et al. . |
| 5,232,866 | 8/1993 | Beyer et al. . |

FOREIGN PATENT DOCUMENTS 3125458  5/1991  Japan .

*Primary Examiner*—George Fourson
*Attorney, Agent, or Firm*—Ladas & Parry

[57] ABSTRACT

A silicon-on-insulator (SOI) isolation structure of a silicon substrate, which has buried gaps between active regions and the substrate, and field oxides to support the active regions. The buried gap is formed by etching an implanted buried silicon nitride layer. Since the dielectric constant of the buried gap is approximately 1, the dielectric effect and isolating effect of this structure are greatly improved.

11 Claims, 5 Drawing Sheets

SILICON-ON-INSULATOR TECHNIQUE WITH BURIED GAP

This is a divisional of application Ser. No. 08/241,183 filed May 11, 1994.

CROSS REFERENCE TO RELATED APPLICATIONS

This application is related to U.S. patent application Ser. No. 08/215,228, filed Mar. 21, 1994, the disclosure of which is hereby incorporated herein by this reference.

1. Field of the Invention

The present invention relates to a silicon-on-insulator (SOI) technique, and, more particularly, to an SOI structure having a buried gap and a method to produce such a structure.

2. Background of the Invention

As long as semiconductor techniques progress, the number of devices on a chip increases greatly. Today's mega-bit memory chips provide several million devices fabricated in a single chip. In such high-density chips, elements must be insulated properly in order to achieve good performance. The main purpose of element insulation techniques is to provide good insulation between elements using less insulation area, thereby making more space available for elements.

In the past, the local oxidation of silicon (LOCOS) technique was widely used in the art of insulation of integrated circuit elements. According to this method, a thick oxide is grown as an insulating layer to insulate each of the elements. FIGS. 1A to 1D show the processing steps of the LOCOS technique. First, a pad oxide layer 11 and then a silicon nitride layer 12 are formed on a silicon substrate 10, and then patterned using lithography and etching techniques as shown in FIG. 1A. Thereafter, impurities are implanted on the uncovered portion of the substrate 10 to form a channel stop implantation layer 13 as shown in FIG. 1B.

Referring to FIG. 1C, a thick field oxide 14 is formed by thermal oxidation. Since the oxidizing speed of silicon nitride is less than that of silicon, the silicon nitride layer 12 works like a mask against thermal oxidation, so that field oxide only grows where the substrate 10 is not covered by the silicon nitride layer 12. At last, silicon nitride layer 12 is removed to obtain an isolation structure as shown in FIG. 1D. Note the formation of defects 16.

The above stated conventional LOCOS technique has a number of disadvantages, especially when applied to sub-micron processes. First, the oxidation of silicon is not limited to the vertical direction but also occurs in the horizontal direction. As a result, a part of the field oxide grows under and lifts the adjacent silicon nitride layer 12 upward resulting in what is termed the "bird's beak effect". Second, due to the pressure caused by the bird's beak effect, a portion of the nitride in the compressed regions of the silicon nitride layer 12 diffuses to adjacent tensile strained regions at the interface of the pad oxide layer 11 and the substrate 10, and forms a silicon-nitride-like layer 15. In later processes of forming gate oxides, the gate oxides will be thinned due to a masking effect of the silicon-nitride-like layer 15. This is termed the "white ribbon effect" because a white ribbon appears at the edges of active regions under optical microscopes.

Additionally, because the volume of silicon dioxide is 2.2 times as large as that of silicon, the field oxide 14 protrudes from the surface of the silicon substrate 10 forming a non-recessed surface. Furthermore, the channel stop implantation layer 13 diffuses laterally during the high temperatures used in forming the field oxide 14, thereby narrowing the width of the active region. This is therefore disadvantageous insofar as scaling down the dimensions of the device. Also, the lateral expansion of the field oxide 14 during formation causes stresses to occur in the active region. Many defects are produced near the bird's beak regions, resulting in increased junction leakage and reduced device reliability.

Many modified processes have been promoted to overcome the above discussed disadvantages of LOCOS, such as: adding a spacer to reduce the bird's beak effect, adding a sacrificial oxide layer to solve the white ribbon effect, or forming a trench before depositing field oxide layer to obtain a flat surface, etc. Each of these process modifications addresses some of the disadvantages of LOCOS, but increases overall processing complexity and reduces production efficiency.

One of the effective methods to achieve this purpose is the silicon-on-insulator (SOI) technique. Its structure mainly comprises a single-crystal silicon layer formed on an insulator, usually thinner than 1 $\mu$m. Insulating trenches are formed which reach the insulator, therefore forming insulated silicon islands on the insulator, where devices can be formed with excellent insulation to devices formed in neighboring insulated silicon islands.

Among all SOI techniques, separation by implanted oxygen (SIMOX) is frequently used. The processes of SIMOX are shown in FIGS. 2A to 2C and discussed herein below. At first a silicon substrate 20 is provided. Oxygen ions are implanted into the substrate 20. Hence, a buried oxide layer 21 is formed in the substrate 20 beneath its surface after annealing. As shown in FIG. 2A, the substrate 20 is divided by the buried oxide 21 into two portions, a surface portion 25 and a bottom portion 26.

Referring to FIG. 2B, trenches 22 are formed by etching predetermined regions of the surface 25. At last, an isolating material is deposited to fill the trenches 22 and form side isolators 23, in order to divide the surface 25 into a plurality of active regions 24 as shown in FIG. 2C. Apparently, all active regions 24 are completely isolated in such a structure.

Although the isolation effect is very good using the SIMOX technique, it suffers from a relatively high parasitic capacitance between the bottom 26 and the active regions 24 so that the operating speed of devices formed in the active region 24 is limited. Since the buried oxide layer 21 is formed by implantation, its maximum thickness is about 0.5 $\mu$m. Furthermore, the above-described parasitic capacitance is very large because the dielectric constants of silicon oxide and silicon nitride are too high (3.8 and 7.5 respectively). Additionally, many defects and residual stresses appear at the interface between the active regions 24 and the buried oxide layer 21, which reduce device reliability.

SUMMARY OF THE INVENTION

The object of the present invention is to provide an SOI structure, which is capable of reducing parasitic capacitance, junction leakage, body effect, stresses and detects, and which has a higher breakdown voltage and resistance to radiation.

The above objects are fulfilled by providing an isolation structure of a silicon substrate for insulating an active region thereon, and a method of forming an isolation structure on a silicon substrate. The isolation structure comprises at least one field oxide surrounding and connecting said active region to support said active region above said substrate. The method comprises the following steps: (a) forming at least one field oxide on the surface portion; (b) implanting nitrogen ions into the substrate using said field oxide as a mask to form at least one buried silicon nitride layer in said substrate; and (c) removing the buried silicon nitride layer to leave a buried gap.

BRIEF DESCRIPTION OF THE DRAWING

The present invention will become more fully understood from the detailed description given hereinafter with reference to the accompanying drawings which are given by way of illustration only, and thus are not limitative of the present invention and wherein.

DETAILED DESCRIPTION OF THE PREFERRED EMBODIMENT

A preferred embodiment of the present invention is shown in FIGS. 3A to 3D and FIGS. 4A to 4D and a method for manufacturing same is described below.

STEP 1

Figure 1A:
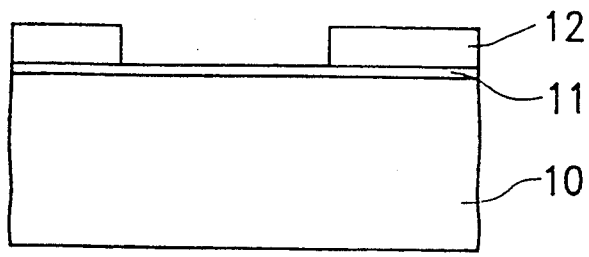
FIGS. 1A to 1D show the processes of conventional LOCOS.
Figure 1B:
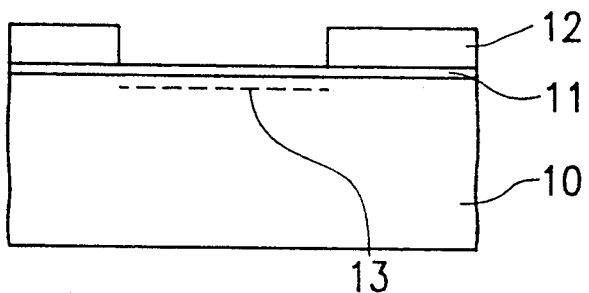
Figure 1C:
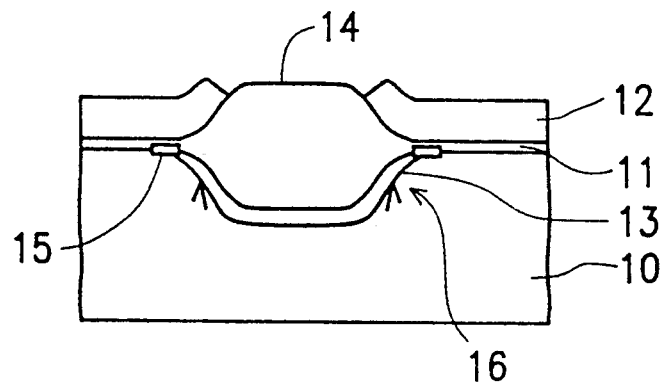
Figure 1D:
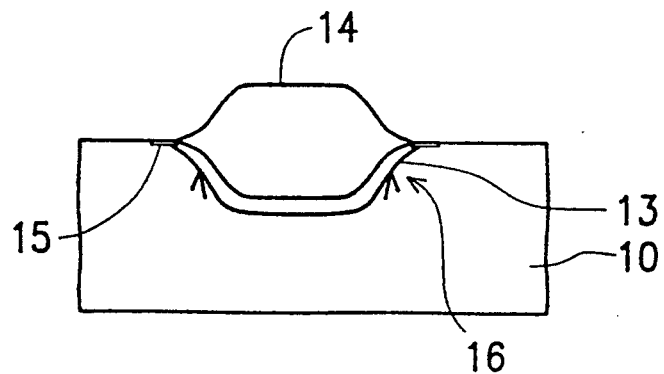
Figure 2A:
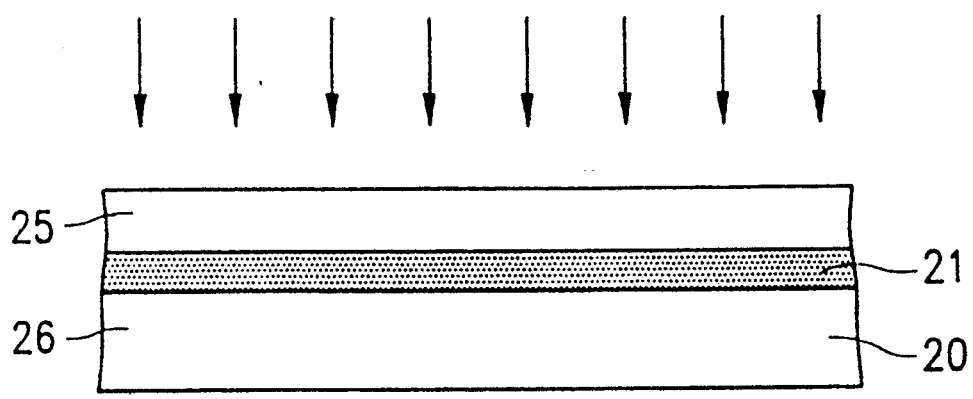
FIGS. 2A to 2C show the processes of conventional SIMOX.
Figure 2B:
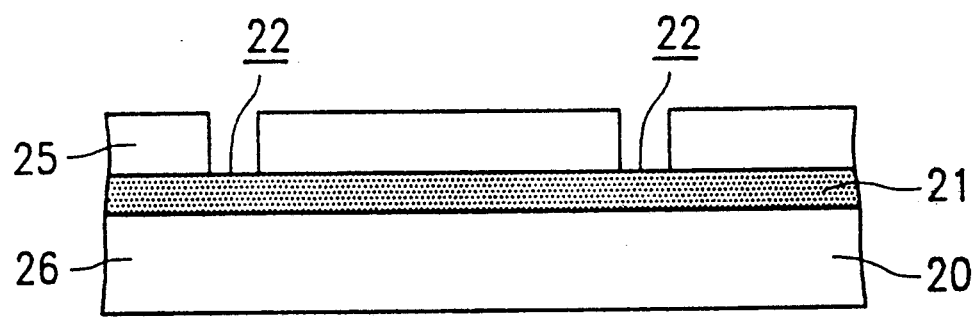
Figure 2C:
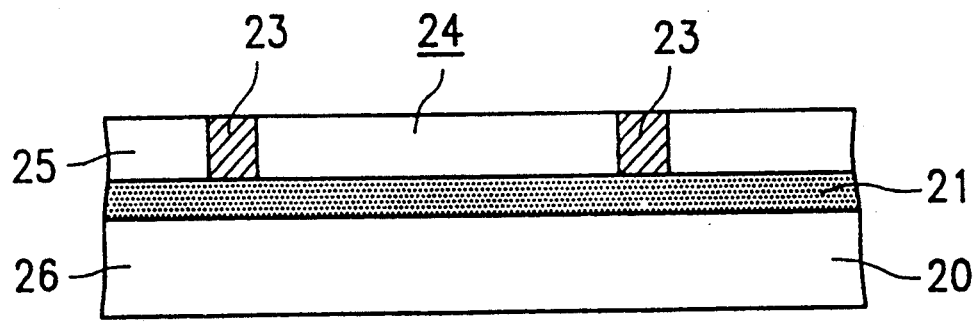
Figure 3A:
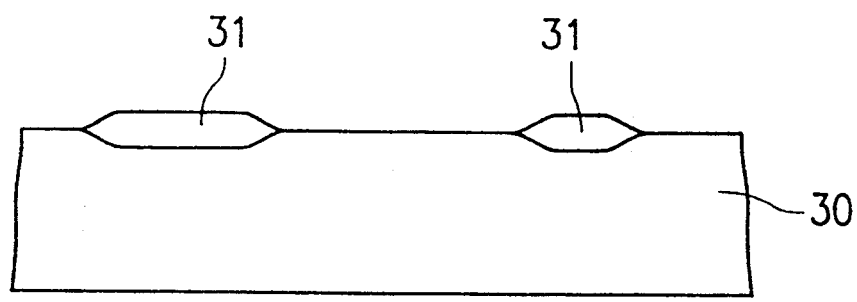
FIGS. 3A to 3D show, in cross sectional views through a silicon substrate, the processes of a preferred embodiment of the present invention.
Figure 4A:
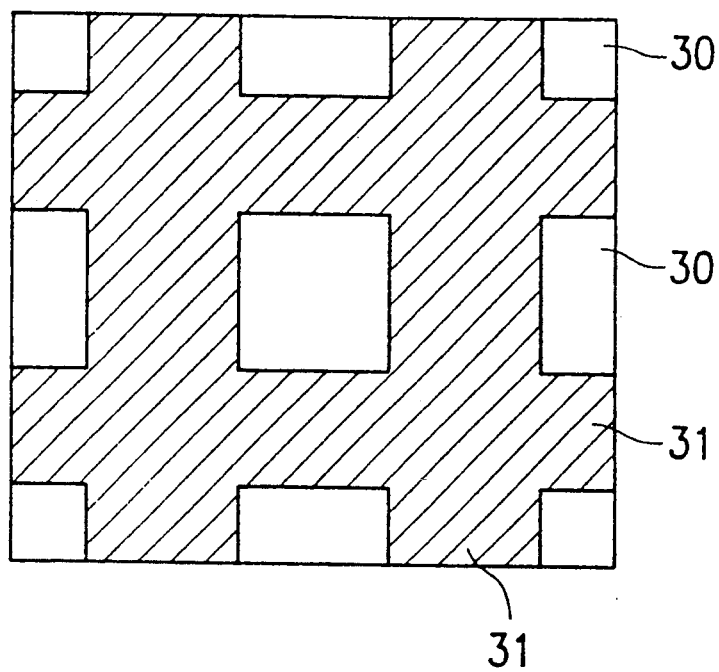
FIGS. 4A to 4D show the structures corresponding to FIGS. 3A to 3D in plan view.

First, field oxides 31 are formed on a silicon substrate 30 by conventional LOCOS processes as shown in FIG. 3A and 4A. The thickness of the field oxides 31 is preferably between 3,000 Å to 10,000 Å.

STEP 2

Figure 3B:
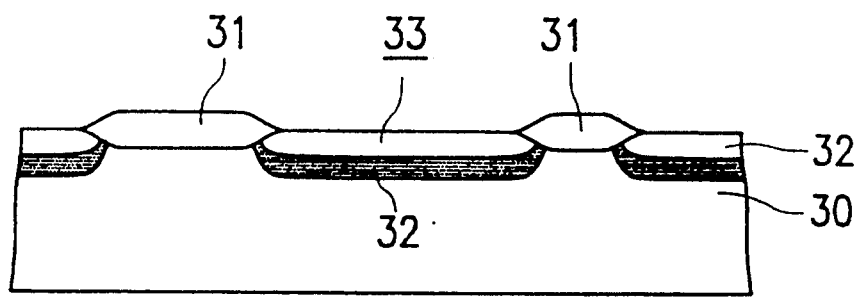
Figure 4B:
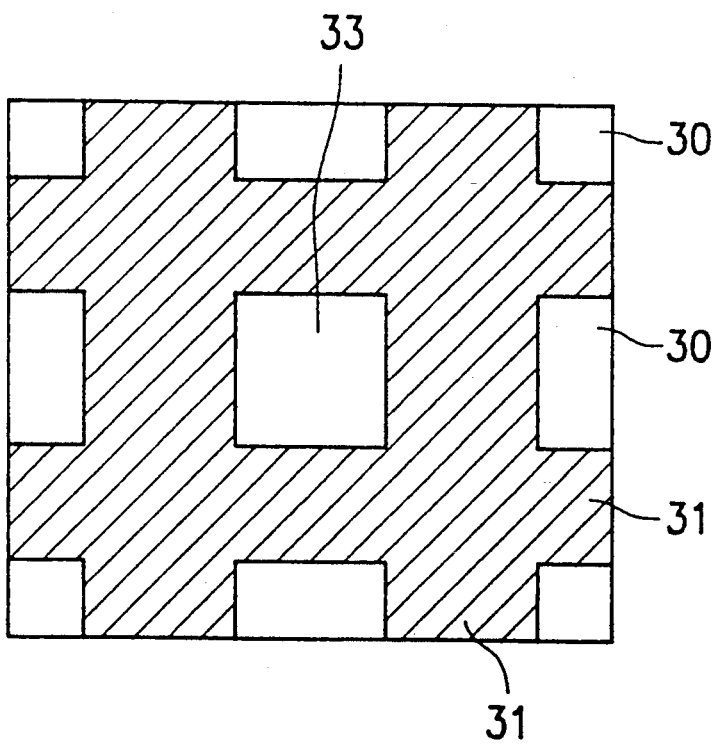

Second, buried silicon nitride layers 32 are formed in the silicon substrate 30 by implanting nitrogen ions into the substrate 30, preferably at 100 to 200 KeV with a dosage between $1 \times 10^{18}$ to $2 \times 10^{18}$ atoms/cm$^2$, using the field oxides 31 as a mask, then annealing the substrate 30, preferably at a temperature between 1100° C. to 1300° C. for 1 to 5 hours. A plurality of active regions 33 are now isolated by the buried silicon nitride layer 32 and the field oxides 31 as shown in FIG. 3B and 4B.

STEP 3

Figure 3C:
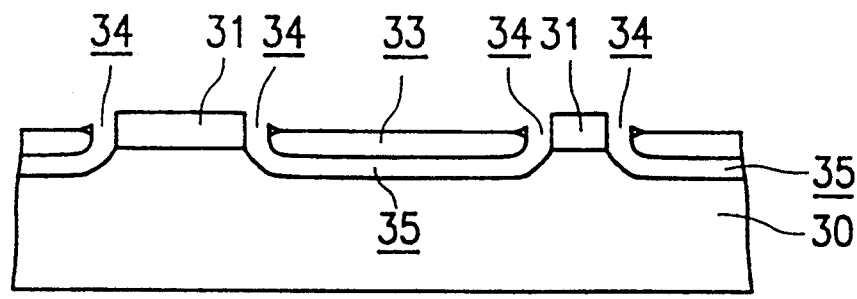
Figure 4C:
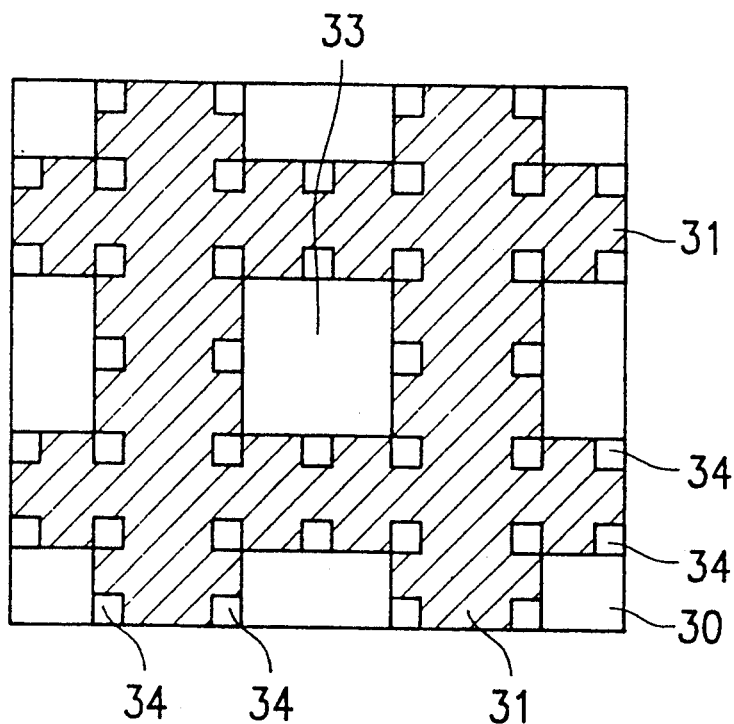
Figure 4D:
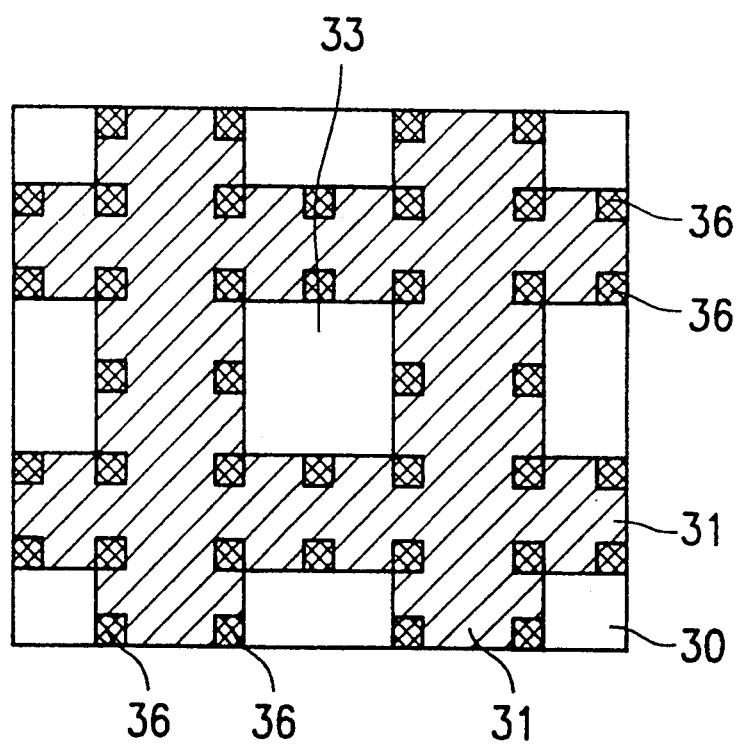

Referring to FIG. 3C and 4C, a plurality of holes 34 are formed in the field oxides 31 near their edges and spaced along the periphery of the field oxides 34. The holes 34 are sufficiently deep to reach the buried silicon nitride layers 32. Next, the buried silicon nitride layers 32 are removed to leave buried gaps 35. The holes 34 can be formed by using conventional lithography and etching techniques. Since the holes 34 are spaced from each other, portions of the field oxide remain to provide support for active regions 33 located above gaps 35. The buried silicon nitride layers 32 can be removed by wet etching, for example, dipping the substrate 30 into a hot phosphoric acid solvent. The phosphoric acid solvent will enter the substrate 30 through holes 34 and etch the buried silicon nitride layers 32. After the etching process, the buried silicon nitride layers 32 are removed, leaving buried gaps 35 under the active regions 33.

STEP 4

The holes 34 are closed by an isolating material 36, e. g. silicon oxide or silicon nitride; before that, the substrate 30 is annealed to remove defects. The substrate 30 can be annealed, for example, at 900° C. to 1000° C. If desired or needed, a thin oxide layer 37 can be formed to achieve better isolation by, for example, thermal growing the oxide layer 37 to obtain the structure shown in FIGS. 3D and 4D. The holes can be then closed by conventional deposition techniques, for example, by depositing an isolator 36, either silicon oxide or silicon nitride or other suitable materials, using physical vapor deposition (PVD) or chemical vapor deposition (CVD), to fill the holes 34.

After the above stated isolation structure is finished, elements can be then formed on the active regions 33 by conventional techniques to produce electronic devices, which need not be further discussed, as such techniques are well known to those skilled in the art.

Figure 3D:
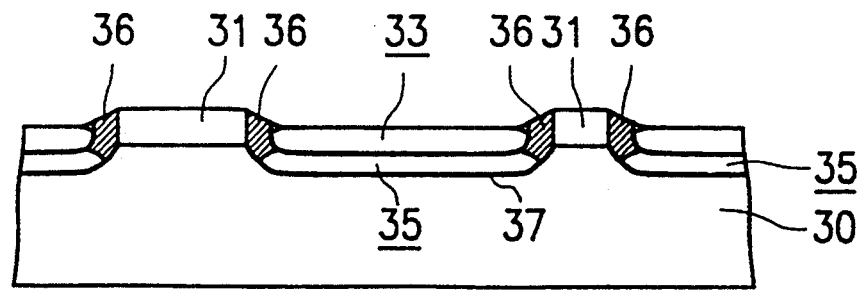

In the isolation structure shown in FIG. 3D, the active regions 33 are fully isolated by conventional LOCOS of field oxides 31 laterally and buried gaps 35 vertically. Since the dielectric constant of the buried gaps 35, which may or may not contain air, is approximately 1, the dielectric isolation effect of the buried gaps 35 is much better than that obtained by using conventionally used isolating materials, like silicon oxide, silicon nitride, etc. that have much higher dielectric constants. This results in several advantages.

First, the parasitic capacitance between active regions and substrate is greatly reduced, therefore the high frequency response is improved, hence the structure can be operated at a much higher speed, therefore it is especially suitable in speed-intensive applications, like radar or satellite communications.

Second, since a gap is disposed between the active regions and the substrate, almost no leakage and body effect occur. Therefore, the structure can be used in lower power applications.

Third, the structure is resistive to radiation, because there is no junction between the active regions and the substrate.

Fourth, the breakdown voltage of the structure is several times higher than conventional SOI structures, so that the structure is more suitable to high voltage application, such as power ICs (integrated circuits), than conventional SOI structures.

Fifth, since the buried oxide layer is removed, leaving room for crystal lattices to re-grow, the stresses and defects appearing at the junction between the active regions and the substrate can be annealed out, thus greatly improving the reliability of the device formed thereon as compared with the conventional SOI structure.

Last, in the aforedescribed structure, the processes are simplified because a channel stop implantation layer is not needed.

While the invention has been described by way of examples and in terms of a preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of forming an isolation structure on a silicon substrate, which comprises the following steps:
   (a) forming at least one field oxide on the surface portion of the substrate;
   (b) implanting nitrogen ions into the substrate using said field oxide as a mask to form and forming at least one buried silicon nitride layer in said substrate; and
   (c) removing said buried silicon nitride layer to leave a buried gap.

2. The method of claim 1, wherein said step (c) comprises:
   (1) forming a plurality of holes connected to said buried silicon nitride layer on said field oxide;
   (2) dipping said substrate into an etchant to etch said buried silicon nitride layer; and
   (3) closing said holes.

3. The method of claim 2, wherein said etchant is phosphoric acid.

4. The method of claim 2, wherein said step (3) is performed by depositing an insulating material into said holes.

5. The method of claim 4, wherein said insulating material is silicon oxide.

6. The method of claim 4, wherein said insulating material is silicon nitride.

7. The method of claim 1, wherein said step (c) further comprises:
   forming a thin oxide layer on facing surfaces of said buried gap.

8. The method of claim 1, wherein said step (c) further comprises:
   annealing said substrate; and
   forming a thin oxide layer on facing surfaces of said buried gap.

9. The method of claim 1, wherein said step (c) further comprises:
   annealing said substrate after said buried silicon nitride layer is removed.

10. The method of claim 1, wherein said field oxide is characterized by a thickness between 3,000 Å and 10,000 Å.

11. The method of claim 1, wherein said step (b) is performed by implanting nitrogen ions into said substrate at 100 KeV to 200 KeV with a dosage between $1 \times 10^{18}$ to $2 \times 10^{18}$ atoms/cm$^2$ and then annealing said substrate at 1100° C. to 1300° C. for less than 5 hours.

* * * * *